United States Patent [19]

Verhoeven

[11] 4,245,170
[45] Jan. 13, 1981

[54] DETECTOR

[75] Inventor: Bernardus Verhoeven, Nijmegen, Netherlands

[73] Assignee: U.S. Philips Corporation, New York, N.Y.

[21] Appl. No.: 9,210

[22] Filed: Feb. 5, 1979

[30] Foreign Application Priority Data

Feb. 21, 1978 [NL] Netherlands ............... 7801907

[51] Int. Cl.³ ............................................. H03K 5/153
[52] U.S. Cl. ................................. 307/360; 307/264; 328/150; 328/149; 330/280
[58] Field of Search ............... 307/237, 264, 360, 362; 328/150, 171–173, 175, 169, 149; 330/138, 280

[56] References Cited

U.S. PATENT DOCUMENTS

| | | | |
|---|---|---|---|
| 3,719,895 | 3/1973 | Van der Pulje | 330/280 |
| 4,143,331 | 3/1979 | Page | 330/280 |

*Primary Examiner*—John Zazworsky
*Attorney, Agent, or Firm*—T. A. Briody; W. J. Streeter; E. W. Goodman

[57] ABSTRACT

A detector suitable for use in a recording amplifier of a cassette recorder for limiting the signal which is applied to the write head at a specific average amplitude. The detector comprises a pre-amplifier T1 to T4 having an input (15) and an output (17); a comparator (T6) having a first input (base) coupled to the output of the pre-amplifier, and a second input (emitter) for detecting whether a detection voltage at the second input is exceeded by the voltage on the first input of the comparator circuit; a reference voltage source ($V_{ref}$); first means (4) for maintaining the d.c. level at the output of the pre-amplifier (T1 to T4) at the level of the reference voltage source ($V_{ref}$); and second means (T10, T11) for raising the detection level of the comparator circuit by the reference voltage.

7 Claims, 1 Drawing Figure

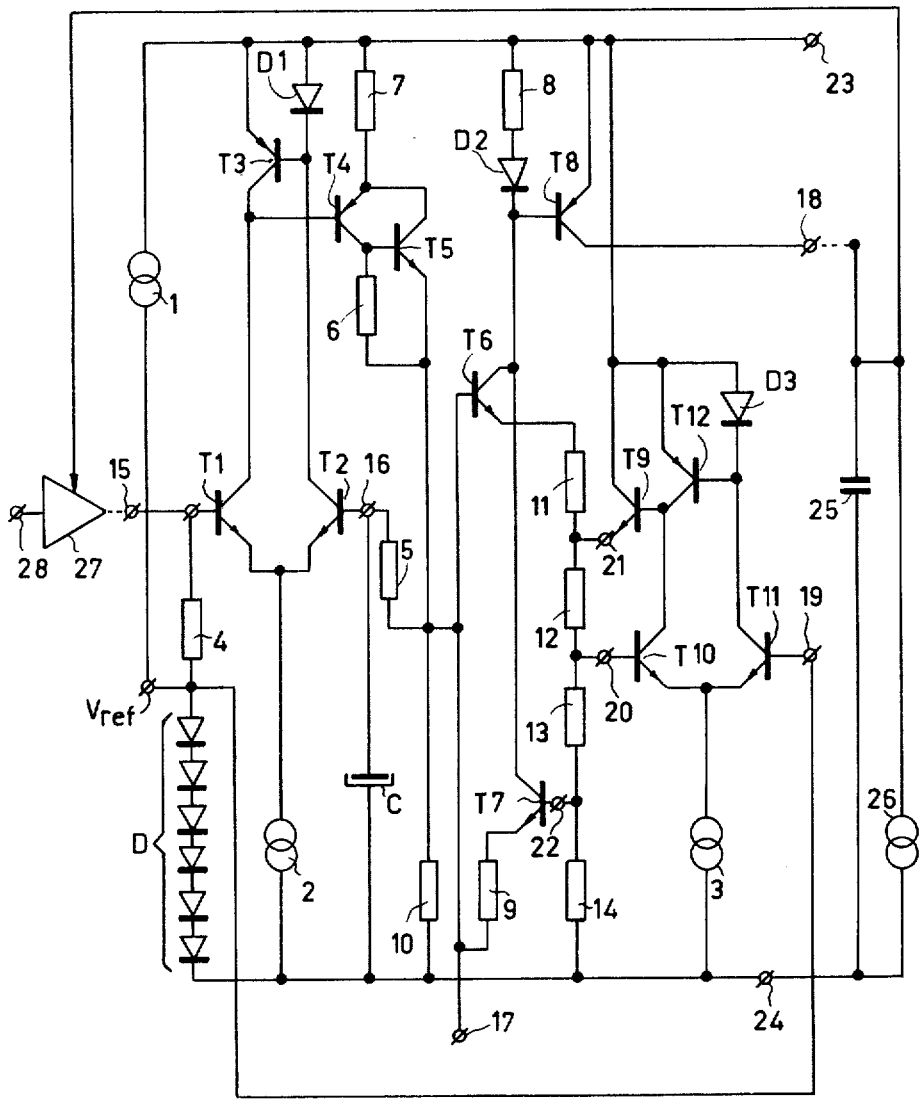

DETECTOR

BACKGROUND OF THE INVENTION

The invention relates to a detector comprising a preamplifier having an input and an output, and a first comparator circuit having a first input, which is coupled to the output of the preamplifier, and a second input for detecting whether a detection voltage at the second input is exceeded by the voltage at the first input of the comparator circuit.

Detectors are for example used in recording amplifiers for magnetic recording in conjunction with a voltage-controlled amplifier, so as to reduce the gain of said amplifier when the amplitude of the signal exceeds a specific limit.

In known detectors the output signal of the preamplifier is applied to a half-wave or full-wave rectifier circuit via a coupling capacitor, so as to filter out the d.c. component. The rectified signal is applied to a comparator circuit.

Since capacitors with high capacitance values cannot be integrated, these capacitors, when the detector is incorporated in an integrated circuit, have to be connected externally. In order to limit the number of external connection points and the number of components to be connected, it is therefore desirable to avoid the use of coupling capacitors.

SUMMARY OF THE INVENTION

It is the object of the invention to provide a detector without a coupling capacitor between preamplifier and comparator circuit and for this the invention is characterized by a reference-voltage source, first means for maintaining the d.c. level at the output of the preamplifier at the level of the reference voltage source and second means for raising the detection level of the comparator circuit by said reference voltage.

The invention is based on the recognition that the d.c. component in the output signal has no adverse effect if this d.c. component is well-defined (by the reference voltage source) and added to the detection level, so that a coupling capacitor may be eliminated.

In respect of said second means, it is advantageous that the second means comprise a first differential amplifier having a first and a second input and an output, of which the first input is connected to the reference voltage source, the output to a supply point of the detector via the series connection of at least a first and a second resistor, and the second input to the junction point between the first and the second resistor, the output of the first differential amplifier being connected to the second input of the comparator circuit.

As the differential amplifier receives negative feedback via the first resistor, the voltage on the second input is equal to the reference voltage. Through the second resistor a constant current flows, whose value is determined by the reference voltage and the value of the second resistor. This current also flows through the first resistor. The voltage on the output is consequently the reference volgage plus a constant voltage, whose value is determined by the ratio of the values of the first and the second resistor and the reference voltage. This lastmentioned constant voltage is the detection level.

It is also advantageous that between the second resistor and the supply point there is included a third resistor, the junction point between the second and the third resistor being connected to a second input of a second comparator circuit, of which a first input is connected to the first input of the first comparator circuit, for comparing the voltage on the first input of the first comparator with the voltage on the second input of the second comparator.

The voltage on the junction point between the second and the third resistor is equal to the reference voltage minus a constant voltage and constitutes a second detection level which together with the first-mentioned level may be situated symmetrically about the reference voltage.

In respect of the first and the second comparator circuit, the invention may further be characterized in that the first comparator circuit comprises a first transistor whose base electrode is connected to the first input and whose emitter electrode is connected to the second input, in that the second comparator circuit comprises a second transistor of the same conductivity type as the first transistor, whose emitter electrode is connected to the first input and whose base electrode is connected to the second input, and in that the collectors of the first and the second transistor are jointly connected to an output of the detector.

The d.c. level at the output of the preamplifier can be maintained at reference voltage level. For this the detector is characterized in that the preamplifier comprises a differential amplifier having a first and a second input, of which the first input constitutes the input of the preamplifier, and that the first means comprise a resistor between the first input of said differential amplifier and the reference voltage source for bringing said first input at reference voltage level, and d.c. negative feedback between the output and the second input of said differential amplifier.

DESCRIPTION OF THE DRAWING

The invention will be described in more detail with reference to the drawing which shows a preferred embodiment of a detector in accordance with the invention.

DESCRIPTION OF THE PREFERRED EMBODIMENT

The circuit arrangement shown comprises a differential amplifier with transistor $T_1$ and $T_2$ in common emitter arrangement, with an emitter current source 2 and a current mirror with a diode $D_1$ and the transistor $T_3$, for coupling out the collector signal currents. The base of transistor $T_1$ is connected to an input 15 and via a resistor 4 to a reference voltage $V_{ref}$, which reference voltage is generated by passing the current from a current source 1 through the series connection D of a plurality of diodes. The coupled-out collector signal current is amplified with an amplifier comprising pnp transistor $T_4$, npn transistor $T_5$ and resistors 6 and 7, and produces a signal voltage on output 17 of the preamplifier across resistor 10. In order to prevent d.c. amplification there is provided negative feedback from the output 17 to the base of transistor $T_2$ via resistor 5. For alternating voltage this negative feedback is inoperative because capacitor C is included between the base of transistor $T_2$ and the power supply point 24. A certain degree of a.c. negative feedback can be obtained by including a resistor in series with the capacitor C.

When a signal current is supplied to input 15, this current produces a signal voltage $V_s$ across resistor 4. The voltage on input 15 of the preamplifier is then equal to $V_{ref}+V_s$. The signal voltage $V_s$ is amplified by a factor A and owing to the negative feedback the voltage $V_{ref}$ is not amplified. The voltage on the output 17 of the preamplifier is consequently equal to $AV_s+V_{ref}$.

In the preamplifier shown, the reference voltage $V_{ref}$ is added to the output signal by adding said reference voltage to the input voltage and by ensuring that the d.c. gain of the preamplifier is unity by means of d.c. negative feedback.

However, this demands negative feedback by means of a capacitor C. However, this negative feedback is necessary in order to reduce the d.c. gain, so as to prevent various offset voltages and the like from being amplified in the case of amplifiers having a very high signal gain.

In principle it is possible to combine the reference voltage $V_{ref}$ with the output signal voltage in different manners, for example by addition to the output signal.

Furthermore, the detector shown comprises a differential amplifier including transistors $T_{10}$ and $T_{11}$ with a common emitter-current source 3 and a current mirror comprising diode $D_3$ and transistor $T_{12}$ for coupling out the difference between the collector currents of transistors $T_{10}$ and $T_{11}$. This difference is amplified by a transistor $T_9$. The emitter of transistor $T_9$ is connected to the base of transistor $T_{10}$ via a resistor 12, which base is connected to the power supply point 24 via resistors 13 and 14.

As a result of the negative feedback via transistor $T_9$ and resistor 12 the voltage on the base of transistor $T_{10}$ is equal to the voltage on the base of transistor $T_{11}$, which is connected to the reference voltage source $V_{ref}$. Through resistors 13 and 14 and thus through resistor 12 a current $T_0$ flows which equals the quotient of the reference voltage $V_{ref}$ and the resistance of the series connection of resistors 13 and 14. If the resistors 12 and 13 have the same resistance value $R_0$, the voltage at the end 21 of resistor 12 which is remote from the base of transistor $T_{10}$ is equal to $V_{ref}+I_0R_0$ and the voltage on point 22 between resistors 13 and 14 is equal to $V_{ref}-I_0R_0$. Thus, two voltages are obtained which are symmetrical relative to the reference voltage $V_{ref}$.

For detecting whether the amplitude of the signal $AV_s$ on output 17 of the preamplifier exceeds the value $I_0R_0$ in a negative or a positive sense, the detector furthermore comprises a transistor $T_7$ whose base is connected to point 22 and whose emitter is connected to output 17 via resistor 9, and a transistor $T_6$ whose base is connected to output 17 and whose emitter is connected to point 21 via resistor 11.

If the voltage $AV_s+V_{ref}$ on output 17 exceeds the voltage $I_0R_0+V_{ref}$ on point 21, transistor $T_6$ is turned on and if said voltage on output 17 exceeds the voltage $-I_0R_0+V_{ref}$ on point 22 in a negative sense, transistor $T_7$ is turned on. The resistors 9 and 11 then limit the currents through transistors $T_6$ and $T_7$.

The collectors of transistors $T_6$ and $T_7$ are interconnected and the sum of the collector currents of transistors $T_6$ and $T_7$ is applied to the output 18 of the detector via an amplifier comprising diode $D_2$, resistor 8 and transistor $T_8$. Thus, a current can be obtained at output 18 each time that the amplitude of the signal $AV_s$ on output 17 of the preamplifier exceeds the detection level $I_0R_0$ in a positive or in a negative sense.

The detector in accordance with the invention may for example be used in a recording amplifier of a cassette recorder for limiting the signal which is applied to the write head at a specific average amplitude. For this purpose, as is indicated by the dashed connections in the Figure, output 18 of the detector is connected to power supply point 24 via a capacitor 25. The capacitor 25 is re-charged each time that one of the transistors $T_6$ or $T_7$ is conductive and is continuously discharged by a current source 26. The voltage across capacitor 25 is consequently a measure of the average value of the amounts by which the signal $AV_s$ on output 17 has exceeded the level $I_0R_0$.

In the present example the voltage across capacitor 25 controls an amplifier 27, whose output is connected to input 15 of the preamplifier and whose input 28 constitutes the input of the recording amplifier. The output 17 of the preamplifier then constitutes the output of the recording amplifier.

If in the present example the resistors 12 and 13 are short-circuited, the detection level is $V_{ref}$ and a full-wave rectifier is obtained which rectifies the signal $AV_s$ without the d.c. component being annoying.

What is claimed is:

1. A detector comprising a preamplifier having an input and an output, and a first comparator circuit having a first input, which is coupled to the output of the preamplifier, and a second input for detecting whether a detection voltage at the second input is exceeded by the voltage on the first input of the comparator circuit, wherein said detector further comprises a reference voltage source, a first means for maintaining a d.c. level at the output of the preamplifier at the level of the reference voltage source, and a second means for raising the detection level of the comparator circuit by said reference voltage.

2. A detector as claimed in claim 1, characterized in that the second means comprise a first differential amplifier having a first and a second input and an output, of which the first input is connected to the reference voltage source, the output to a power supply point of the detector via the series connection of at least a first and a second resistor, and the second input to the junction point between the first and the second resistor, the output of the first differential amplifier being connected to the second input of the comparator circuit.

3. A detector as claimed in claim 2, characterized in that a third resistor is included between the second resistor and the power supply point, the junction point between the second and third resistor being connected to a second input of a second comparator circuit, of which a first input is connected to the first input of the first comparator circuit, for comparing the voltage on the first input with the voltage on the second input.

4. A detector as claimed in claim 3, characterized in that the first comparator circuit comprises a first transistor whose base electrode is connected to the first input and whose emitter electrode is connected to the second input.

5. A detector as claimed in claim 4, characterized in that the second comparator circuit comprises a second transistor of the same conductivity type as the first transistor, whose emitter electrode is connected to the first input and whose base electrode is connected to the second input.

6. A detector as claimed in claim 5, characterized in that the collectors of the first and the second transistor are jointly connected to an output of the detector.

7. A detector as claimed in any one of the preceding claims, characterized in that the preamplifier comprises a differential amplifier having a first and second input, of which the first input constitutes the input of the preamplifier, and that the first means comprise a resistor between the first input of said differential amplifier and the reference voltage source for bringing said first input at reference voltage level, and d.c. negative feedback between the output and the second input of said differential amplifier.

* * * * *